(12) United States Patent
Dremel et al.

(10) Patent No.: US 10,479,295 B2
(45) Date of Patent: Nov. 19, 2019

(54) CONTROLLER FOR A MULTI-VOLTAGE ON-BOARD POWER SUPPLY

(71) Applicant: Brose Fahrzeugteile GmbH & Co. KG, Bamberg, Bamberg (DE)

(72) Inventors: Benedikt Dremel, Stegaurach (DE); Anto Mijac, Bamberg (DE)

(73) Assignee: Brose Fahrzeugteile GMBH & Co. KG, Bamberg, Bamberg (DE)

( * ) Notice: Subject to any disclaimer, the term of this patent is extended or adjusted under 35 U.S.C. 154(b) by 152 days.

(21) Appl. No.: 15/542,055

(22) PCT Filed: Jan. 21, 2016

(86) PCT No.: PCT/EP2016/051181
§ 371 (c)(1),
(2) Date: Dec. 14, 2017

(87) PCT Pub. No.: WO2016/120142
PCT Pub. Date: Aug. 4, 2016

(65) Prior Publication Data
US 2018/0126926 A1 May 10, 2018

(30) Foreign Application Priority Data
Jan. 29, 2015 (DE) .......................... 10 2015 201 572

(51) Int. Cl.
*B60R 16/023* (2006.01)
*H03K 19/0175* (2006.01)
(Continued)

(52) U.S. Cl.
CPC ............ *B60R 16/023* (2013.01); *B60R 16/03* (2013.01); *H03K 17/567* (2013.01);
(Continued)

(58) Field of Classification Search
CPC .... B60R 16/023; B60R 16/03; H03K 17/567; H03K 17/687; H03K 19/017509;
(Continued)

(56) References Cited

U.S. PATENT DOCUMENTS

| | | | |
|---|---|---|---|
| 5,646,552 A * | 7/1997 | Ota | H03K 17/76 326/30 |
| 2016/0159296 A1* | 6/2016 | Mijac | B60R 16/03 307/9.1 |

(Continued)

*Primary Examiner* — William Hernandez
(74) *Attorney, Agent, or Firm* — Lewis Roca Rothgerber Christie LLP

(57) ABSTRACT

What is presented is a control device for a multi-voltage on-board electrical system of a vehicle, wherein the multi-voltage on-board electrical system has a first electrical subsystem, which is configured to be operated with a first supply voltage from a first voltage supply source, and a second electrical subsystem, which is configured to be operated with a second supply voltage from a second voltage supply source. The control device comprises: a transceiver, which is connected to ground via a first ground terminal of the first electrical subsystem and which is configured for communicating with a communication component of the first electrical subsystem; a control unit, which is connected to the same ground via a second ground terminal of the second electrical subsystem and which is configured for controlling a power component of the second electrical subsystem; a transmission path, which couples a signal output of the control unit to a signal input of the transceiver, wherein the transmission path is configured for transmitting a control signal provided by the control unit at the signal output towards the signal input of the transceiver; a diode arranged in the transmission path, the cathode terminal of said diode being coupled to the second ground terminal. Provision is furthermore made of a number of field effect transistors, wherein the number of field effect transistors on the one hand couples the transmission path to the first (Continued)

voltage supply source and/or to the second voltage supply source and on the other hand couples said transmission path to the first ground terminal and/or to the second ground terminal.

21 Claims, 4 Drawing Sheets

(51) Int. Cl.
  *H03K 19/0185*  (2006.01)
  *H03K 19/0944*  (2006.01)
  *B60R 16/03*  (2006.01)
  *H03K 17/567*  (2006.01)
  *H03K 17/687*  (2006.01)
  *H04L 12/40*  (2006.01)
  *H04B 1/38*  (2015.01)

(52) U.S. Cl.
  CPC ... *H03K 17/687* (2013.01); *H03K 19/017509* (2013.01); *H03K 19/018521* (2013.01); *H03K 19/018592* (2013.01); *H03K 19/0944* (2013.01); *H04B 1/38* (2013.01); *H04L 2012/40234* (2013.01)

(58) Field of Classification Search
  CPC ... H03K 19/018521; H03K 19/018592; H03K 19/0944; H04L 2012/40234; H04B 1/38
  USPC .................................. 307/9.1, 10.1
  See application file for complete search history.

(56) References Cited

U.S. PATENT DOCUMENTS

2016/0221452 A1*   8/2016   Dremel ............... B60L 11/1803
2017/0072881 A1*   3/2017   Mijac ..................... B60R 16/03
2018/0222409 A1*   8/2018   Binder ..................... H02J 1/10

* cited by examiner

CONTROLLER FOR A MULTI-VOLTAGE ON-BOARD POWER SUPPLY

CROSS-REFERENCE TO A RELATED APPLICATION

This application is a National Phase Patent Application of International Patent Application Number PCT/EP2016/051181, filed on Jan. 21, 2016, which claims priority of German Patent Application Number 10 2015 201 572.6, filed on Jan. 29, 2015, the contents of both of which are incorporated herein by reference.

DESCRIPTION

The present invention relates to a control device for a multi-voltage on-board electrical system of a vehicle, and to a control device for a multi-voltage on-board electrical system of a vehicle.

Occasionally a vehicle, for example a car, lorry, train, etc., is equipped with a multi-voltage electrical system. The multi-voltage on-board electrical system comprises at least a first electrical subsystem and a second electrical subsystem. The first electrical subsystem is configured to be operated with a first supply voltage, for example 12 V, from a first voltage supply source. The second electrical subsystem is configured to be operated with a second supply voltage, for example 48 V, from a second voltage supply source.

A control device that can be coupled both to the first electrical subsystem and to the second electrical subsystem is occasionally used in such a multi-voltage on-board electrical system. Consequently, both voltage levels of the two electrical subsystems can be present within the control device.

By way of example, such a control device comprises a transceiver, which is connected to ground, for example vehicle ground, via a first ground terminal and is configured for communicating with a communication component of the first electrical subsystem. By way of example, such a transceiver comprises a so-called local interconnect network (LIN) transceiver.

Moreover, such a control device can comprise a control unit, which is connected to ground, for example vehicle ground, via a second ground terminal of the second electrical subsystem and is configured for controlling a power component of the second electrical subsystem.

The transceiver is usually coupled to the control unit. By way of example, a number of control signal paths are provided for these purposes. A transmission path couples for example a signal output of the control unit to a signal input of the transceiver and, in the opposite direction, a reception path can couple a signal output of the transceiver to a signal input of the control unit.

What is problematic in the case of such a control device is clean separation between the two electrical subsystems, particularly in the case of a defective operating voltage supply in the first electrical subsystem and/or in the second electrical subsystem.

It is an object of the present invention to fashion the coupling between the transceiver and the control unit of the control device in such a way that a control signal can be reliably transmitted between the transceiver and the control unit.

Features of advantageous embodiments are specified in the dependent claims. The features defined by the dependent claims can be combined with one another to form further exemplary embodiments, unless they are expressly described as alternative to one another.

In the case of the control device of the first aspect, a transmission path couples a signal output of the control unit to a signal input of the transceiver. The transmission path is configured for transmitting a control signal provided by the control unit at the signal output towards the signal input of the transceiver. A diode is arranged in the transmission path, the cathode terminal of said diode being coupled to the second ground terminal. Furthermore, provision is made of a number of field effect transistors, wherein the number of field effect transistors on the one hand couples the transmission path to the first voltage supply source and/or to the second voltage supply source and on the other hand couples said transmission path to the first ground terminal and/or to the second ground terminal. By way of example, the diode arranged in the transmission path is coupled to the second ground terminal via one of the number of field effect transistors.

In the case of the control device of the second aspect, a reception path couples a signal output of the transceiver to a signal input of the control unit. The reception path is configured for transmitting a control signal provided by the transceiver at the signal output towards the signal input of the control unit. A diode is arranged in the reception path, the cathode terminal of said diode being coupled to the second ground terminal. Furthermore, in the case of the control device of the second aspect, provision is made of a number of transistors, wherein the number of transistors on the one hand couples the reception path to the first voltage supply source and/or to the second voltage supply source and on the other hand couples said reception path to the first ground terminal and/or to the second ground terminal. By way of example, the diode arranged in the reception path is coupled to the second ground terminal via a number of transistors.

The two aspects presented above can be combined with one another. In one embodiment of the control device, therefore, the transceiver and the control unit are coupled to one another via said reception path and via said transmission path.

In one embodiment of the control device of the first aspect, the diode arranged in the transmission path is configured to block a flow of a current from the first electrical subsystem into the second electrical subsystem via the transmission path. In this respect, the diode arranged in the transmission path can produce a separation of the two electrical subsystems.

In one embodiment of the control device of the second aspect, the diode arranged in the reception path is configured to block a flow of a current from the second electrical subsystem into the first electrical subsystem via the reception path. In this respect, the diode arranged in the reception path can produce a separation of the two electrical subsystems.

In a further embodiment of the control device of the first aspect, the number of field effect transistors is configured to produce a signal level in the transmission path depending on a state of the signal output of the control unit. By way of example, the signal output of the control unit is a terminal which the control unit can optionally put into one of the states "LOW", "HIGH" or "HZ" (high impedance). Depending on which state the signal output of the control unit has, the number of field effect transistors can produce a corresponding signal level in the transmission path. The transceiver, the signal input of which is coupled to the transmission path, can receive the control signal provided by the control unit with the signal level produced by the number of field effect transistors.

In a further embodiment of the control device of the second aspect, the number of transistors is configured to generate a signal level on the transmission path depending on a state of the signal output of the transceiver. By way of example, the transceiver is configured to put its signal output into one of the states "HIGH", "LOW" or "HZ" (high impedance). Depending on which state the signal output of the transceiver is in, the number of transistors can produce a corresponding signal level in the reception path. The control unit, the signal input of which is coupled to the reception path, can receive the control signal provided by the transceiver with the signal level produced by the number of transistors.

Examples of specific interconnections of the transistors and of the field effect transistors in the reception path and in the transmission path, respectively, will be explained in greater detail with reference to the drawings.

First, further features of the control device of the first aspect and of the control device of the second aspect shall be explained below. The following text expressly applies both to the control device of the first aspect and to the control device of the second aspect. Therefore, hereinafter mention is always made of "the control device".

The control device is configured for example for use in a multi-voltage on-board electrical system of a vehicle, for example for use in a multi-voltage on-board electrical system of a car.

The multi-voltage on-board electrical system is for example a 12 V/48 V multi-voltage on-board electrical system. By way of example, therefore, the first voltage supply source provides a first supply voltage having a voltage of approximately 12 V and the second voltage supply source provides a second supply voltage of approximately 48 V.

The second supply voltage can therefore be greater than the first supply voltage.

The first supply voltage is present with reference to the first ground terminal and the second supply voltage is present with reference to the second ground terminal.

The first ground terminal is arranged in a manner separated from the second ground terminal, for example, wherein both ground terminals can be connected to the same ground, for example vehicle ground. The two ground terminals can each comprise an ground pin, for example. The first ground terminal and the second ground terminal usually carry approximately the same potential. In the case of a defective operating voltage supply, however, a potential difference between the two ground terminals can occur, which will be discussed in somewhat greater detail at a later point.

As already indicated above, the first supply voltage can be a DC voltage and the second supply voltage can likewise be a DC voltage. The voltage supply sources each comprise a battery and/or a rectifier arrangement, for example, which provides a DC voltage as first and/or second supply voltage.

By way of example, the control device comprises a first supply contact for receiving the first supply voltage, a second supply contact for receiving the second supply voltage, a first ground contact, which is connected to the first ground terminal, and a second ground contact, which is connected to the second ground terminal. Said contacts of the control device are arranged for example on a housing of the control device. By way of example, the first supply voltage is present between the first supply contact and the first ground contact and, by way of example, the second supply voltage is present between the second supply contact and the second ground contact.

By way of example, both the control unit and the transceiver are arranged within the housing of the control device.

The transceiver comprises for example a local interconnect network (LIN) transceiver. By way of example, the transceiver is an LIN transceiver.

The transceiver has a first ground port, for example, which is connected to the first ground terminal. This connection can be effected for example via said first ground contact of the control device. The transceiver can furthermore have a first supply port coupled to the first voltage supply source. This coupling can be effected for example via said first supply contact of the control device. In this way, the transceiver can be supplied with energy by the first voltage supply source. By way of example, current at the first supply voltage is thus fed to the transceiver. It goes without saying that a voltage converter can also be provided in the corresponding supply path that couples the supply port of the transceiver to the first voltage supply source.

The transceiver is configured for communicating with a communication component of the first electrical subsystem. Said communication component is arranged outside the control device, for example. The communication component can comprise for example a vehicle control component, a diagnosis component, an electronic data processing facility, etc. By way of example, the communication component is configured to communicate in accordance with the LIN standard. In one embodiment, the transceiver is thus configured to exchange signals with the communication component in accordance with the LIN standard. For these purposes, the transceiver can comprise a communication interface which is connected to the communication component of the first electrical subsystem for example via a number of communication signal contacts of the control device.

Said communication interface can have one or a plurality of pins of the transceiver. Likewise, the signal input and the signal output of the transceiver can be configured for example in each case in the form of a pin.

The control unit can comprise a microcontroller, for example. By way of example, the control unit is a microcontroller.

The control unit is connected to the same ground, for example vehicle ground, via the second ground terminal of the second electrical subsystem. Such a coupling to the second ground terminal can be effected for example via said second ground contact of the control device. By way of example, to that end a second ground port of the control unit is connected to the second ground contact. The control unit can have a second supply port, which is coupled to the second voltage supply source, for example, such that the control unit can be supplied with energy by the second voltage supply source. By way of example, said coupling is effected by means of said second supply contact of the control device. A voltage converter can be provided in the corresponding supply path between the second supply contact and the second supply port of the control unit, which voltage converter receives the second supply voltage provided by the second voltage supply source via the second supply contact and converts said supply voltage into an operating voltage for the control unit.

The signal output and the signal input of the control unit are configured for example in each case in the form of a pin.

The control unit is configured for controlling a power component of the second electrical subsystem. The power component comprises a converter arrangement, for example, which provides a power signal, for example a single- or polyphase AC voltage signal for an electric motor. By way of example, the control unit controls a driver of the converter arrangement and the converter arrangement provides the power signal for the motor to be controlled, depending on driver output signals. The power component of the second electrical subsystem is supplied for example with energy by the second voltage supply source. By way of example, the control unit has a control signal interface that couples the control unit to the power component of the second electrical subsystem.

The transceiver and the control unit are operatively coupled to one another. By way of example, a plurality of control signal paths are provided for this coupling, which control signal paths can be configured in each case in the form of unidirectional control signal paths, which thus allow a transmission of the control signal only in one direction.

From the standpoint of the control unit, at least one of the control signal paths is the transmission path explained above, via which a control signal is transmitted from the control unit towards the transceiver. From the standpoint of the control unit, another of the control signal paths is the reception path explained above, via which a control signal is transmitted from the transceiver towards the control unit.

Further features and advantages of the control device, in particular further features and advantages of the transmission path and of the reception path, will become clear from the following description of exemplary embodiments with reference to the figures, in which:

FIG. 1 shows a schematic and exemplary illustration of part of a multi-voltage on-board electrical system 3 comprising a control device in accordance with one or a plurality of embodiments.

Figure 1:
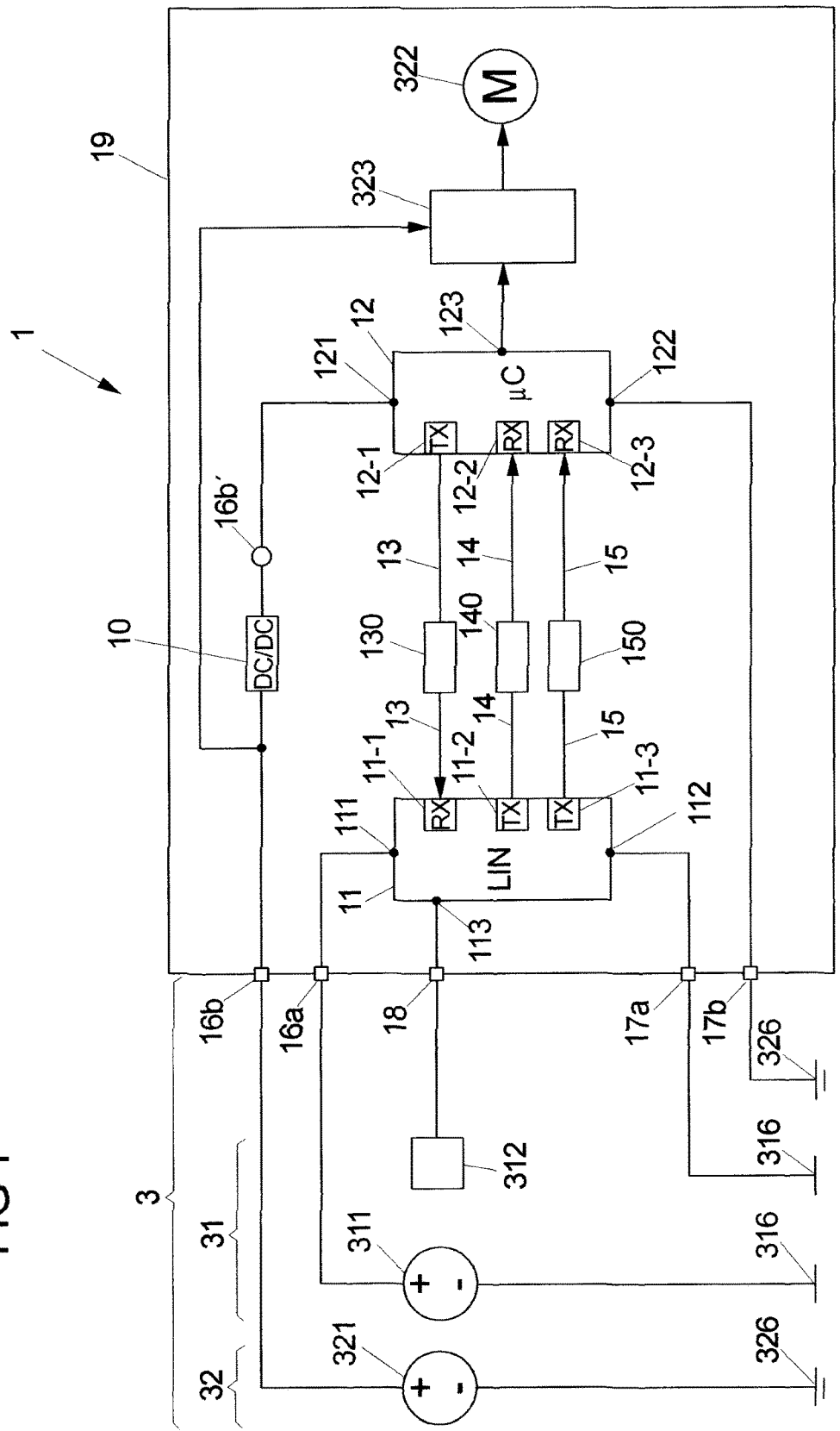
FIG. 1 shows a schematic and exemplary illustration of part of a multi-voltage on-board electrical system comprising a control device in accordance with one or a plurality of embodiments.

The multi-voltage on-board electrical system 3 is for example a multi-voltage on-board electrical system of a vehicle, for example of a car. The multi-voltage on-board electrical system 3 comprises a first electrical subsystem 31 and a second electrical subsystem 32. The first electrical subsystem 31 is operated with a first supply voltage from a first voltage supply source 311 and the second electrical subsystem 32 is operated with a second supply voltage from a second voltage supply source 321.

The first voltage supply source 311 comprises a first battery and/or a first rectifier arrangement, for example. By way of example, the first voltage supply source 311 provides a DC voltage of approximately 12 V.

The second voltage supply source 321 comprises a second battery and/or a second rectifier arrangement, for example. By way of example, the second voltage supply source 321 provides a DC voltage of approximately 48 V.

The first supply voltage is present relative to a first ground terminal 316 and the second supply voltage is present relative to a second ground terminal 326.

The two ground terminals 316 and 326 can be present in each case in the form of ground pins or the like. The first ground terminal 316 is usually arranged in a manner separated from the second ground terminal 326. Both ground terminals 316 and 326 are connected to the same ground, for example the vehicle ground. The two ground terminals 316 and 326 usually carry the same potential. However, if a defective operating voltage supply occurs, it can happen that a potential difference between the two ground terminals 316 and 326 arises, which will be discussed in somewhat greater detail at a later point.

The first electrical subsystem 31 furthermore comprises a communication component 312. By way of example, the communication component 312 is configured to provide and receive signals in accordance with the LIN standard. By way of example, the communication component 312 comprises a vehicle control arrangement, an electronic data processing facility, a diagnosis facility and/or the like.

In the case of the example illustrated in FIG. 1, the second electrical subsystem 32 comprises an electric motor 322 and a converter arrangement 323, which comprises for example a power electronic converter and a driver provided for controlling the power electronic converter. The converter arrangement 323 is supplied with energy by the second voltage supply source 321. By way of example, the converter arrangement 323 receives the second supply voltage provided by the second voltage supply source 321 and converts said supply voltage into a voltage signal, for example an AC voltage signal, for the electric motor 322.

The control device 1 comprises a transceiver 11 and a control unit 12. The transceiver 11 comprises an LIN transceiver, for example. By way of example, the transceiver 11 is an LIN transceiver. The control unit 12 comprises a microcontroller (μC), for example. By way of example, the control unit 12 is a microcontroller.

The transceiver 11 and the control unit 12 can be arranged in a housing 19 of the control device 1. The control device 1 comprises for example a first supply contact 16a for receiving the first supply voltage, a second supply contact 16b for receiving the second supply voltage, a first ground contact 17a, which is connected to the first ground terminal 316, and a second ground contact 17b, which is connected to the second ground terminal 326. Said contacts 16a, 16b, 17a and 17b can be arranged on the housing 19 of the control device 1.

By way of example, the first supply voltage is present between the first supply contact 16a and the first ground contact 17a and, by way of example, the second supply voltage is present between the second supply contact 16b and the second ground contact 17b.

The transceiver 11 comprises a first supply port 111, which is coupled to the first voltage supply source 311. This coupling is effected for example via said first supply contact 16a. Furthermore, the transceiver 11 comprises a first ground port 112, which is coupled to the ground terminal 316. This coupling is effected for example via said first ground contact 17a of the control device 1. In this way, the transceiver 11 can be supplied with energy from the first voltage supply source 311. A voltage converter (not illustrated in the figures) can be provided between the first voltage supply source 311 and the first supply port 111, which voltage converter converts the first supply voltage produced by the first supply source 311 into an operating voltage for the transceiver 11.

The transceiver 11 is configured for communicating with the communication component 312 of the first electrical subsystem. By way of example, the transceiver 11 comprises a communication interface 113 that can be connected to the communication component 312 of the first electrical subsystem 31 via a number of communication contacts 18 of the control device 1. By way of example, the communication interface 113 comprises a number of pins. For example, the transceiver 11 exchanges signals with the communication component 312 in accordance with the LIN standard. The transceiver 11 can thus be assigned to the first electrical subsystem 31.

The control unit 12 comprises a second supply port 121, which is coupled to the second voltage supply source 321. By way of example, this coupling is effected via said second supply contact 16b of the control device 1. A voltage converter 10 can be provided between the second voltage supply source 321 and the second supply port 121 of the control unit 12, which voltage converter converts the second supply voltage provided by the second voltage supply source 321 into an operating voltage for the control unit 12. By way of example, the voltage converter 10 provides the operating voltage, that is to say: the converted second supply voltage, at a voltage converter output 16b'. On the other hand, the control unit 12 comprises a second ground port 122, which is coupled to the second ground terminal 326. This coupling is effected for example via said second contact 17b of the control device 1. In this way, the control unit 12 can be supplied with energy from the second voltage supply source 321.

The control unit 12 is configured for controlling a power component of the second electrical subsystem 32, for example for operating the electric motor 322 by means of the converter arrangement 323. For these purposes, the control unit 12 has a control signal interface 123, for example, by means of which the control unit 12 can control the converter arrangement 323, for example a driver of the converter arrangement 323. By way of example, the converter arrangement 323 converts the second supply voltage produced by the second voltage supply source 321 into a single- or polyphase AC voltage for the electric motor 322 depending on the signals present at the control signal interface 123.

The electric motor 322 serves for example for a drive of the vehicle, for example for opening and closing a tailgate of the vehicle, for opening and closing a window of the vehicle, for operating a brake of the vehicle, or for realizing a propulsion of the vehicle.

The transceiver 11 and the control unit 12 are operatively coupled to one another. For this coupling, a number of control signal paths are provided, of which three control signal paths 13, 14 and 15 are illustrated in FIG. 1, wherein more or fewer than the three control signal paths 13, 14 and 15 can also be provided in other embodiments.

Each of the control signal paths 12, 14 and 15 couples a signal output (identified in each case as TX) to a signal input (designated in each case as RX). The control signal paths 13, 14 and 15 can each be unidirectional control signal paths configured to transmit a control signal in each case only from a signal output towards a signal input, but not in the opposite direction.

By way of example, the first control signal path 13 couples a first signal output 12-1 of the control unit to a first signal input 11-1 of the transceiver 11. From the standpoint of the control unit, this control signal path 13 is a transmission path. Hereinafter mention is made mainly of the "transmission path 13".

Furthermore, the second control signal path 14 can couple a second signal output 11-2 of the transceiver 11 to a second signal input 12-2 of the control unit 12. From the standpoint of the control unit 12, this control signal path 14 is a reception path, which will be designated hereinafter mainly as "first reception path 14".

Moreover, the third control signal path 15, for example, couples a third signal output 11-3 of the transceiver 11 to a third signal input 12-3 of the control unit 12. From the standpoint of the control unit 12, this third control signal path 15 is likewise a reception path, which will be designated hereinafter mainly as "second reception path 15".

The transmission path 13 is configured, for example, to transmit a control signal provided by the control unit 12 at the first signal output 12-1 towards the first signal input 11-1 of the transceiver 11. In a similar manner, the first reception path 14 can be configured to transmit a control signal provided by the transceiver 11 at the second signal output 11-2 towards the second signal input 12-2 of the control unit 12. Likewise, the second reception path 15 can be configured to transmit a further control signal provided by the transceiver 11 at the third signal output 11-3 towards the third signal input 12-3 of the control unit 12.

The first signal input 11-1, the second signal output 11-2 and the third signal output 11-3 are present for example in each case in the form of a pin, for example in the form of a pin of an LIN transceiver. The first signal output 12-1, the second signal input 12-2 and the third signal input 12-3 of the control unit 12 are present for example in each case in the form of a pin, for example in the form of a pin of a microcontroller.

By way of example, the transceiver 11 is configured to put the first signal input 11-1 into the state "HZ" in order to receive the control signal transmitted by the transmission path 13. The transceiver 11 can furthermore be configured to put the second signal output 11-2 optionally into one of the states "LOW", "HIGH", "HZ" in order to transmit a control signal towards the control unit 12 by means of the first reception path 14. Likewise, the transceiver 11 can be configured to put the third signal output 11-3 optionally into one of the states "LOW", "HIGH" or "HZ" in order to transmit a control signal towards the control unit 12 via the second reception path.

By way of example, the control unit 12 is configured to put the second signal input 12-2 and the third signal input 12-3 in each case into the state "HZ" in order to receive the control signal transmitted by means of the first reception path 14 or by means of the second reception path 15. Furthermore, the control unit 12 can be configured to put the first signal output 12-1 optionally into one of the states "LOW", "HIGH" or "HZ" in order to transmit a control signal towards the transceiver 11 via the transmission path 13.

The transmission path 13 can comprise a first circuit module 130. The first reception path 14 can comprise a second circuit module 140, and the second reception path 15 can comprise a third circuit module 150.

The circuit modules 130, 140 and 150 can each comprise at least one diode and a number of transistors in order that specific safety-relevant functions and/or requirements regarding a signal quality and/or requirements regarding a signal timing can be fulfilled during the signal transmission.

To put it generally, each of the circuit modules 130, 140 and 150 can be configured to assume a blocking state in response to a defective operating voltage supply in the first electrical subsystem 31 and/or in the second electrical subsystem 32, in which blocking state the transmission of the control signal via the relevant control signal path 13, 14 and 15, respectively, is prevented. Therefore, if a defective operating voltage supply is present, for example, then each of the circuit modules 130, 140 and 150 can be configured to block the corresponding path 13, 14, 15, respectively, such that the signal transmission is prevented.

The defective operating voltage supply is present, for example, if at least one of the following is applicable:
the transceiver 11 is no longer connected to ground;
the control unit 12 is no longer connected to ground;
a short circuit in the first electrical subsystem 31 and/or in the second electrical subsystem 32;
a potential difference between the first ground terminal 316 and the ground terminal 326 exceeds a threshold value.

The last fault situation mentioned is also referred to as ground offset, for example. The threshold value can have an absolute value of 1 V, for example. However, this value can also be varied by corresponding dimensioning of the components of the circuit modules 130, 140 and 150.

The first two fault situations mentioned (the transceiver 11 is no longer connected to ground, and the control unit 12 is no longer connected to ground) are occasionally also referred to as ground interruption.

In particular, each of the circuit modules 130, 140 and 150 can be configured to prevent a breakdown from the electrical subsystem having the higher supply voltage, for example the second electrical subsystem 32, into the electrical subsystem having the lower supply voltage, for example the first electrical subsystem 31, via the relevant control signal path 13, 14 and 15, respectively. For these purposes, in particular each of the circuit modules 130, 140 and 150 can have said diode.

Concrete examples of configurations of the first circuit module 130, of the second circuit module 140 and of the third circuit module 150 will now be explained with reference to FIG. 2 to FIG. 4.

Figure 2:
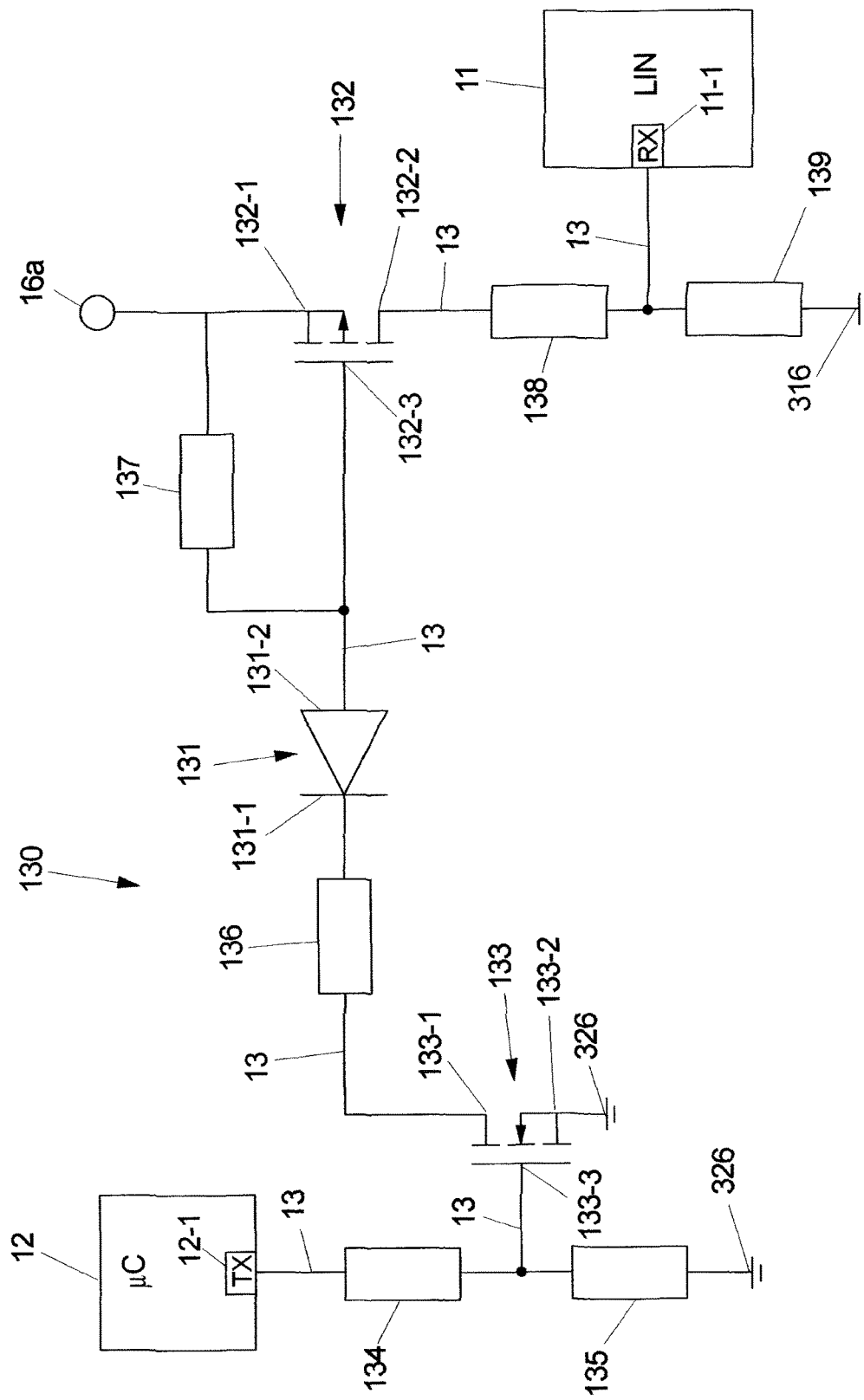
FIG. 2 shows a schematic and exemplary illustration of components of a control device in accordance with one or a plurality of embodiments.

FIG. 2 shows a schematic and exemplary illustration of the first circuit module 130. The first circuit module 130 is at least partly arranged in the transmission path 13.

The first circuit module 130 comprises a diode 131, the cathode terminal 131-1 of which is coupled to the second ground terminal 326. Furthermore, the first circuit module 130 comprises a number of field effect transistors 132 and 133, wherein the number of field effect transistors 132 and 133 couples the transmission path 13 on the one hand to the first voltage supply source 311 and on the other hand to the first ground terminal 321 and to the second ground terminal 326.

By way of example, the coupling of the cathode terminal 131-1 of the diode 131 arranged in the transmission path 13 to the second ground terminal 326 is effected via the second field effect transistor 133, wherein an ohmic resistor 136 can also be arranged for this purpose. The cathode terminal 131-1 leads via the ohmic resistor 136 towards a first signal terminal 133-1 of the second field effect transistor 133.

A second signal terminal 133-2 of the second field effect transistor 133 is connected to the second ground terminal 326, wherein this connection can be effected for example via said second ground contact 17b. A control terminal 133-3 of the second field effect transistor 133 is on the one hand coupled to the first signal output 12-1 of the control unit via a resistor 134. The control terminal 133-3 is on the other hand coupled to the second ground terminal 326 via a further ohmic resistor 135. The two ohmic resistors 134 and 135 are optional; the control terminal 133-3 could also be connected directly to the first signal output 12-1 and directly to the second ground terminal 326.

With the first field effect transistor 132, the transmission path 13 is coupled to the first voltage supply source 311. This coupling is effected by means of said first supply contact 16a, for example.

An anode terminal 131-2 of the diode 131 is connected firstly directly to a control terminal 132-3 of the first field effect transistor 132 and secondly via an ohmic resistor 137 to the first voltage supply source 311, specifically via said first supply contact 16a, for example, which can also be connected to the first signal terminal 132-1. A second signal terminal 132-2 of the first field effect transistor 132 is connected to the first signal input 11-1 of the transceiver 11, for example via a further ohmic resistor 138, wherein this ohmic resistor 138 is optional; the second signal terminal 132-2 could also be connected directly to the first signal input 11-1. Furthermore, the first signal input 11-1 of the transceiver 11 is connected to the first ground terminal 316 via a further ohmic resistor 139.

The connection between the transmission path 13 and the two ground terminals 316 and 326 can in particular also be effected via the ground contacts 17a, and 17b (not illustrated in FIG. 2).

The diode 131 can be configured to block a current flow from the second electrical subsystem 32 towards the first electrical subsystem 31 via the transmission path 13. The second electrical subsystem 32 can be, as stated, the electrical subsystem which is operated with the higher supply voltage.

Via the two field effect transistors 132 and 133 it is possible to generate a level for the control signal that is intended to be transmitted from the first signal output 12-1 towards the first signal input 11-1 of the transceiver.

By means of the two field effect transistors 132 and 133, it is possible to provide a signal level for the control signal to be transmitted via the transmission path 13. By way of example, the control unit 12 controls the two field effect transistors 132 and 133 by optionally putting the first signal output 12-1 into one of said states "LOW", "HIGH" or "HZ". By way of example, said field effect transistors 132 and 133 can be switched on (become conducting) or switched off (become blocking) depending on the state of the first signal output 12-1.

The field effect transistors 132 and 133 have the advantage over comparable bipolar transistors that they can be switched comparatively rapidly.

Consequently, the transmission path 13 with the first circuit module 130 is suitable, in particular, for transmitting dynamic signals, that is to say signals whose level is intended to change comparatively rapidly and frequently.

The two field effect transistors 132 and 133 are each implemented as a MOSFET, for example. The first field effect transistor 132 is configured as a normally off p-channel MOSFET, for example. In this variant, the first signal terminal 132-1 is a source terminal, the second signal terminal 132-2 is a drain terminal and the control terminal 132-3 is a gate terminal. The second field effect transistor 132 is configured as a normally off n-channel MOSFET, for example. In this variant, the first signal terminal 133-1 is configured as a drain terminal, the second signal terminal 133-2 is configured as a source terminal and the control terminal 133-3 is configured as a gate terminal.

Figure 3:
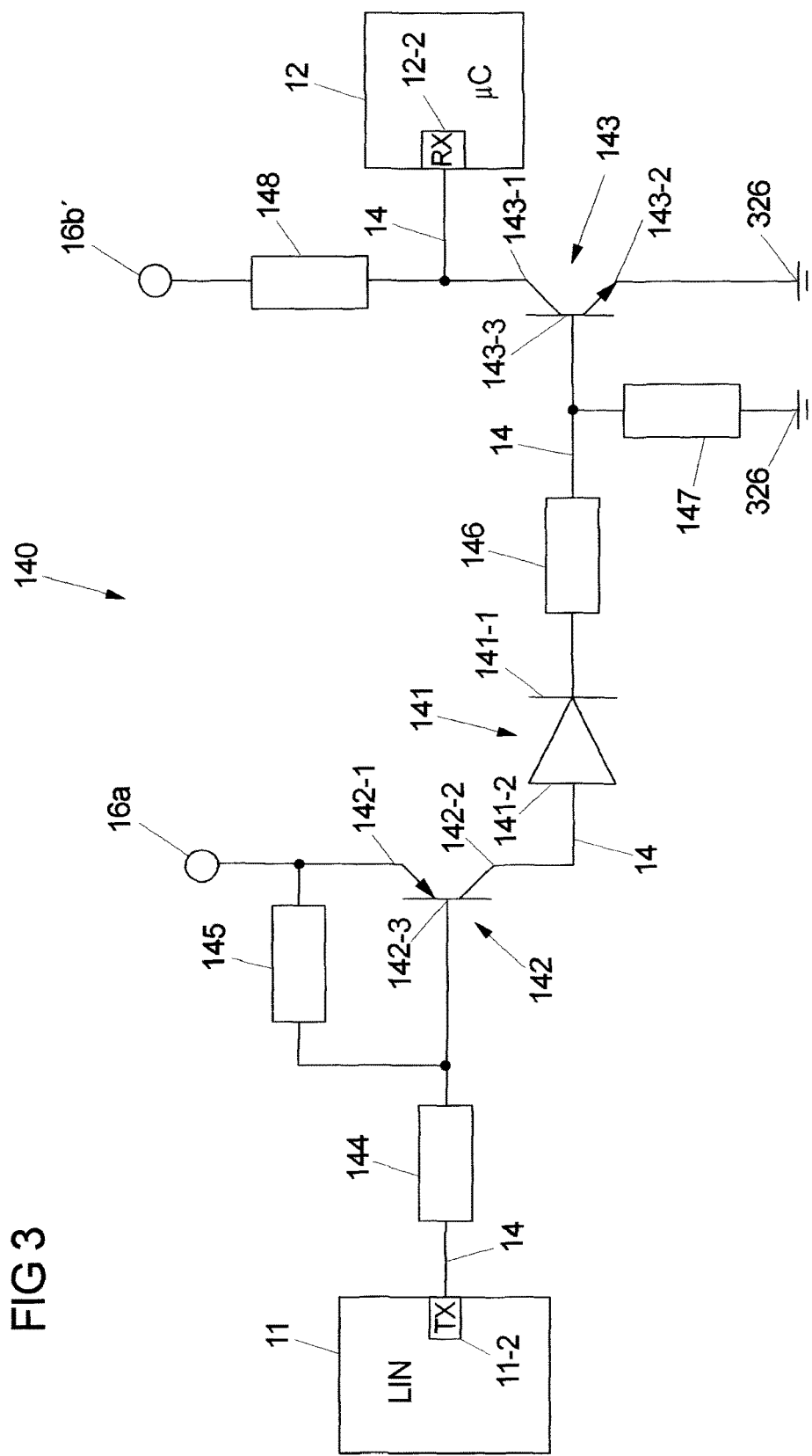
FIG. 3 shows a schematic and exemplary illustration of components of a control device in accordance with one or a plurality of embodiments.

FIG. 3 shows a schematic and exemplary illustration of the second circuit module 140, which is arranged at least partly in the first reception path 14.

The second circuit module 140 has a diode 141 arranged in the first reception path 14, the cathode terminal 141-1 of said diode being coupled to the second ground terminal 326.

Furthermore, the second circuit module 140 has a number of transistors 142 and 143, wherein the number of transistors 142 and 143 couples the first reception path on the one hand to the first voltage supply source 311 and to the second voltage supply source 321 and on the other hand to the second ground terminal 326.

By way of example, the cathode terminal 141-1 is coupled to the second ground terminal 326 with the aid of ohmic resistors 146 and 147. The connection between the ohmic resistor 147 and the second ground terminal 326 can in turn be effected via said second ground contact 17*b*.

The coupling of the first reception path 14 to the first voltage supply source 311 is effected by means of the first transistor 142, for example, the first signal terminal 142-1 of which is connected to said first supply contact 16*a*, for example.

The coupling to the second voltage supply source 321 is effected for example by means of an ohmic resistor 148 and the voltage converter 10 (not illustrated in FIG. 3), which provides a converted second supply voltage at its voltage converter output 16*b*'.

The ohmic resistor 148 is coupled both to the second signal input 12-2 of the control unit 12 and to a first signal terminal 143-1 of the second transistor 143. A second signal terminal 143-2 of the second transistor 143 is directly coupled to the second ground terminal 326. This coupling can in turn be effected by means of the second ground contact 17*b*. A control terminal 143-3 is likewise connected to the second ground terminal 326 via the ohmic resistor 147 already mentioned.

The second signal output 11-2 of the transceiver 11 is connected to a control terminal 142-3 of the first transistor 142 via an ohmic resistor 144. The first signal terminal 142-1, already mentioned, of the first transistor 142 is connected to the control terminal 142-3 of the first transistor 142 via yet another ohmic resistor 145. A second signal terminal 142-2 is directly connected to an anode terminal 141-2 of the diode 141 arranged in the first reception path 14.

The diode 141 arranged in the first reception path 14 can be configured to block a current from the second electrical subsystem 32 towards the first electrical subsystem 31 via the first reception path 14. A current flow via the first reception path 14 is possible for example only in the opposite direction on account of the diode 141.

A signal level for the control signal to be transmitted via the first reception path 14 can be provided by means of the two transistors 142 and 143. By way of example, the transceiver 11 controls the two transistors 142 and 143 by optionally putting the second signal output 11-2 into one of said states "LOW", "HIGH" or "HZ". By way of example, said transistors 142 and 143 can be switched on (become conducting) or switched off (become blocking) depending on the state of the second signal output 11-2.

The second circuit module 140, which is arranged at least partly in the first reception path 14, is suitable for example for transmitting less dynamic signals, such as a WAKE-UP signal, for example. By way of example, the two transistors 142 and 143 are each configured as bipolar transistors. The first transistor 142 is a pnp transistor, for example. In this variant, the first signal terminal 142-1 is an emitter terminal, the second signal terminal 142-2 is a collector terminal and the control terminal 142-3 is a base terminal.

The second transistor 143 is an npn transistor, for example. In this variant, the first signal terminal 143-1 is a collector terminal, the second signal terminal 143-2 is an emitter terminal and the control terminal 143-3 is a base terminal.

Figure 4:
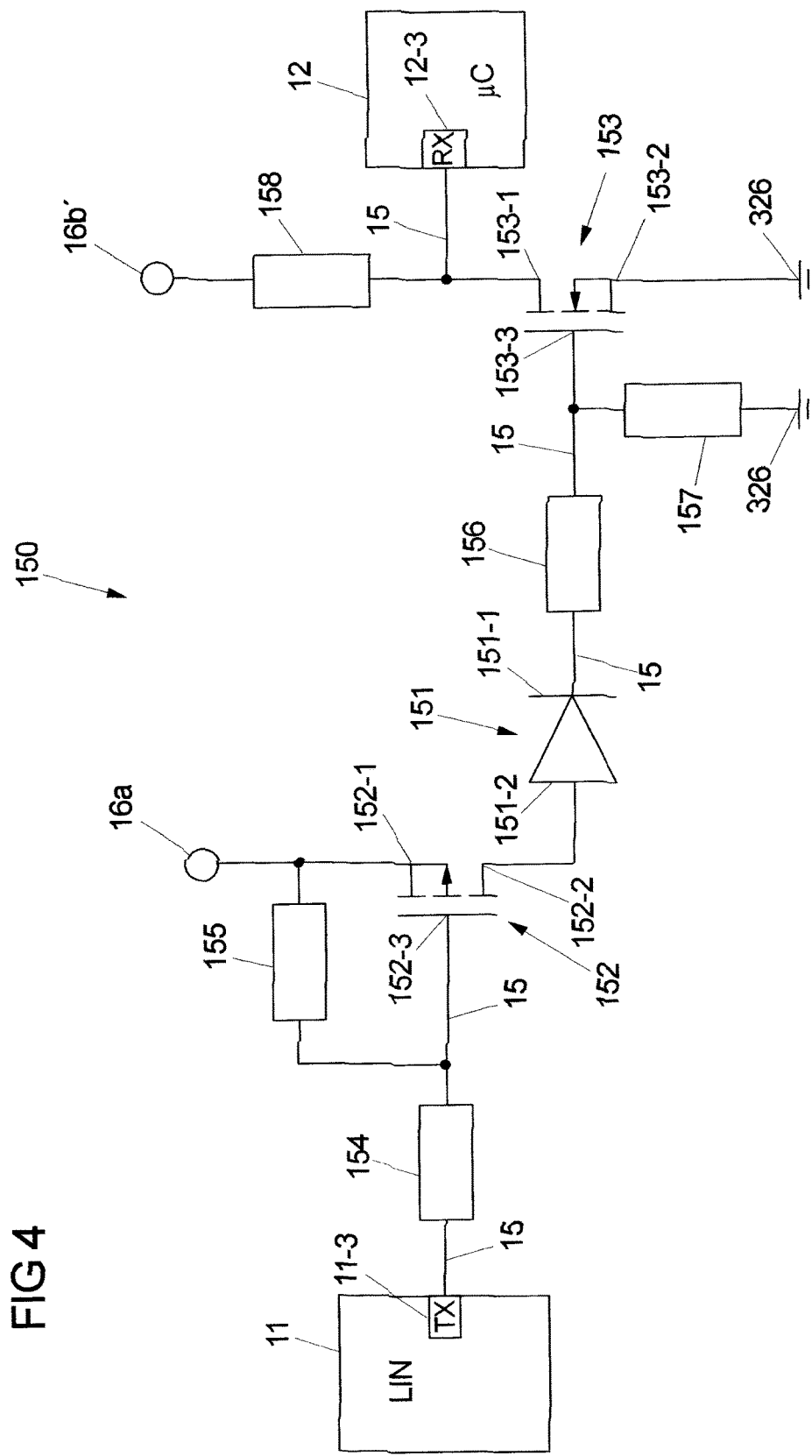
FIG. 4 shows a schematic and exemplary illustration of components of a control device in accordance with one or a plurality of embodiments.

FIG. 4 shows a schematic and exemplary illustration of the third circuit module 150, which is arranged at least partly in the second reception path 15.

The third circuit module 150 comprises a diode 151 arranged in the second reception path 15, the cathode terminal 151-1 of said diode being coupled to the second ground terminal 326. Furthermore, the third circuit module 150 comprises a number of transistors 152 and 153, wherein the number of transistors 152 and 153 couples the second reception path 15 on the one hand to the first voltage supply source 311 and to the second voltage supply source 321 and on the other hand to the second ground terminal 326.

By way of example, the cathode terminal 151-1 of the diode 151 is coupled to the second ground terminal 326 via ohmic resistors 156 and 157, wherein the ohmic resistor 156 is optional. The cathode terminal 151-1 of the diode 151 is connected to a control terminal 153-3 of the second transistor 153 via the optional resistor 156. If the ohmic resistor 156 is not provided, then the cathode terminal 151-1 is directly connected to the control terminal 153-3. The control terminal 153-3 of the second transistor 153 is coupled to the second ground terminal via said ohmic resistor 157.

For the rest, the interconnection of the third circuit module 150 substantially corresponds to the interconnection of the second circuit module 140 illustrated by way of example in FIG. 3. In this respect, reference is made to the text above.

By way of example, therefore, the second reception path 15 is coupled to the first voltage supply source 321 via the first transistor 152, wherein this coupling can be effected in particular via said first supply contact 16*a*.

A coupling of the second reception path 15 to the second voltage supply source 321 is effected, for example, via a further ohmic resistor 158, which can be connected to the voltage converter output 16*b*', which can carry the converted second supply voltage.

On the part of the control unit 12, the third signal output 12-3 is connected to a first control terminal 153-1 of the second transistor 153. A second signal terminal 153-2 of the second transistor 153 is coupled to the second ground terminal 326.

On the part of the transceiver 11, the third signal output 11-3 is coupled to a control terminal 152-3 of the first transistor 152 via an ohmic resistor 154. A further ohmic resistor 155 connects the control terminal 152-3 to a first signal terminal 152-1 of the first transistor 152. A second signal terminal 152-2 is connected to an anode terminal 151-2 of the diode 151.

By way of example, the two transistors 152 and 153 are configured to generate a level for the signal to be transmitted via the second reception path 15. By way of example, the transceiver 11 controls the two transistors 152 and 153 by optionally putting the third signal output 11-1 into one of said states "LOW", "HIGH" or "HZ". By way of example, the transistors 152, 153 are either switched on (become conducting) or switched off (become blocking) as a result.

In the second reception path 15, the two transistors 152 and 153 of the third circuit module 150 are configured in each case as field effect transistors, for example as MOSFETs. The second reception path 15 is thus suitable for example for the transmission of comparatively dynamic control signals whose level is intended to change comparatively rapidly and frequently.

The first transistor 152 is configured as a normally off p-channel MOSFET, for example. In this variant, the first signal terminal 152-1 is a source terminal, the second signal terminal 152-2 is a drain terminal and the control terminal 152-3 is a gate terminal.

The second transistor 153 is configured as a normally off n-channel MOSFET, for example. In this variant, the first signal terminal 153-1 is a drain terminal, the second signal terminal 153-2 is a source terminal and the control terminal 153-3 of the second transistor 153 is a gate terminal.

In one embodiment of the control device 1, the transceiver 11 and the control unit 12 are operatively coupled to one another at least via the transmission path 13, the first reception path 14 and the second reception path 15, wherein the first circuit module 130 is at least partly contained in the transmission path 13, the second circuit module 140 is at least partly contained in the first reception path 14 and the third circuit module 150 is at least partly contained in the second reception path 15, wherein the first circuit module 130 is configured for example as illustrated in FIG. 2, the second circuit module 140 is configured for example as illustrated in FIG. 3 and the third circuit module 150 is configured for example as illustrated in FIG. 4. Furthermore, further control signal paths can be provided in order to produce the operative coupling of the transceiver 11 to the control unit 12.

The text above has always cited the known 12 V/48 V multi-voltage on-board electrical system of a vehicle as an example of a multi-voltage on-board electrical system. It goes without saying, however, that the present invention is not restricted to such multi-voltage on-board electrical systems. Rather, voltage levels other than the 12 V level or the 48 V level can also be employed.

LIST OF REFERENCE SIGNS 1 control device
10 voltage converter
11 transceiver
11-1 first signal input
11-2 second signal output
11-3 third signal output
111 first supply port
112 first ground port
133 communication interface
12 control unit
12-1 first signal output
12-2 second signal input
12-3 third signal input
121 second supply port
122 second ground port
123 control signal interface
13 transmission path
130 first circuit module
131 diode
131-1 cathode terminal of the diode
131-2 anode terminal of the diode
132 first field effect transistor
132-1 first signal terminal of the first field effect transistor
132-2 second signal terminal of the first field effect transistor
132-3 control terminal of the first field effect transistor
133 second field effect transistor
133-1 first signal terminal of the second field effect transistor
133-2 second signal terminal of the second field effect transistor
133-3 control terminal of the second field effect transistor
134, . . . , 139 ohmic resistors
14 first reception path
140 second circuit module
141 diode
141-1 cathode terminal of the diode
141-2 anode terminal of the diode
142 first bipolar transistor
142-1 first signal terminal of the first bipolar transistor
142-2 second signal terminal of the first bipolar transistor
142-3 control terminal of the first bipolar transistor
143 second bipolar transistor
143-1 first signal terminal of the second bipolar transistor
143-2 second signal terminal of the second bipolar transistor
143-3 control terminal of the second bipolar transistor
144, . . . , 148 ohmic resistors
15 second reception path
150 third circuit module
151 diode
151-1 cathode terminal of the diode
151-2 anode terminal of the diode
152 first field effect transistor
152-1 first signal terminal of the first field effect transistor
152-2 second signal terminal of the first field effect transistor
152-3 control terminal of the first field effect transistor
153 second field effect transistor
153-1 first signal terminal of the second field effect transistor
153-2 second signal terminal of the second field effect transistor
153-3 control terminal of the second field effect transistor
154, . . . , 158 ohmic resistors
16a first supply contact
16b second supply contact
16b' voltage converter output
17a first ground contact
17b second ground contact
18 communication signal contact(s)
19 housing
3 multi-voltage on-board electrical system
31 first electrical subsystem
311 first voltage supply source
312 communication component of the first electrical subsystem
316 first ground terminal
32 second electrical subsystem
321 second voltage supply source
322 electric motor
323 converter arrangement
326 second ground terminal

The invention claimed is:

1. A control device for a multi-voltage on-board electrical system of a vehicle, wherein the multi-voltage on-board electrical system has a first electrical subsystem, which is configured to be operated with a first supply voltage from a first voltage supply source, and a second electrical subsystem, which is configured to be operated with a second supply voltage from a second voltage supply source; the control device comprising:

a transceiver, which is connected to ground via a first ground terminal of the first electrical subsystem and which is configured for communicating with a communication component of the first electrical subsystem;

a control unit, which is connected to the same ground via a second ground terminal of the second electrical subsystem and which is configured for controlling a power component of the second electrical subsystem;

a transmission path, which couples a signal output of the control unit to a signal input of the transceiver, wherein the transmission path is configured for transmitting a control signal provided by the control unit at the signal output towards the signal input of the transceiver;
a diode arranged in the transmission path, the cathode terminal of said diode being coupled to the second ground terminal; and
a number of field effect transistors, wherein the number of field effect transistors on the one hand couples the transmission path to the first voltage supply source and/or to the second voltage supply source and on the other hand couples said transmission path to the first ground terminal and/or to the second ground terminal.

2. The control device according to claim 1, wherein the number of field effect transistors comprises a first field effect transistor arranged in the transmission path, said first field effect transistor having a first signal terminal coupled to the first voltage supply source and a second signal terminal coupled to the signal input of the transceiver.

3. The control device according to claim 2, wherein an anode terminal of the diode is coupled to a control terminal of the first field effect transistor.

4. The control device according to claim 3, wherein the first signal terminal of the first field effect transistor is coupled to the control terminal of the first field effect transistor via an ohmic resistor.

5. The control device according to claim 2, further comprising a second field effect transistor arranged in the transmission path, said second field effect transistor having:
a first signal terminal coupled to the cathode terminal of the diode;
a second signal terminal coupled to the second ground terminal;
a control terminal coupled to the signal output of the control unit,
wherein an anode terminal of the diode is coupled to a control terminal of the first field effect transistor, and
wherein the control terminal of the first field effect transistor is coupled to the first signal terminal of the second field effect transistor via the diode.

6. The control device according to claim 2, wherein the second signal terminal of the first field effect transistor is coupled to the first ground terminal via a further ohmic resistor.

7. The control device according to claim 1, wherein the number of field effect transistors comprises a second field effect transistor arranged in the transmission path, said second field effect transistor having:
a first signal terminal coupled to the cathode terminal of the diode;
a second signal terminal coupled to the second ground terminal;
a control terminal coupled to the signal output of the control unit.

8. The control device according to claim 1, wherein the control unit comprises a microcontroller.

9. The control device according to claim 1, wherein the transceiver comprises a local interconnect network transceiver.

10. The control device according to claim 1, wherein the second supply voltage is greater than the first supply voltage.

11. The control device according to claim 1, wherein the first supply voltage is related to the first ground terminal and the second supply voltage is related to the second ground terminal.

12. The control device according to claim 1, wherein the control device comprises:
a first supply contact for receiving the first supply voltage;
a second supply contact for receiving the second supply voltage;
a first ground contact, which is connected to the first ground terminal;
a second ground contact, which is connected to the second ground terminal.

13. The control device according to claim 1, wherein the ground is the ground of the vehicle.

14. A control device for a multi-voltage on-board electrical system of a vehicle, wherein the multi-voltage on-board electrical system has a first electrical subsystem, which is configured to be operated with a first supply voltage from a first voltage supply source, and a second electrical subsystem, which is configured to be operated with a second supply voltage from a second voltage supply source; the control device comprising:
a transceiver, which is connected to ground via a first ground terminal of the first electrical subsystem and which is configured for communicating with a communication component of the first electrical subsystem;
a control unit, which is connected to the same ground via a second ground terminal of the second electrical subsystem and which is configured for controlling a power component of the second electrical subsystem;
a reception path, which couples a signal output of the transceiver to a signal input of the control unit, wherein the reception path is configured for transmitting a control signal provided by the transceiver at the signal output towards the signal input of the control unit;
a diode arranged in the reception path, the cathode terminal of said diode being coupled to the second ground terminal; and
a number of transistors, wherein the number of transistors on the one hand couples the reception path to the first voltage supply source and/or to the second voltage supply source and on the other hand couples said reception path to the first ground terminal and/or to the second ground terminal.

15. The control device according to claim 14, wherein the number of transistors comprises a first transistor arranged in the reception path, said first transistor having a first signal terminal coupled to the first voltage supply source and a control terminal coupled to the signal output of the transceiver.

16. The control device according to claim 15, wherein an anode terminal of the diode is coupled to a second signal terminal of the first transistor.

17. The control device according to claim 15, wherein the first signal terminal of the first transistor is coupled to the control terminal of the first transistor via an ohmic resistor.

18. The control device according to claim 15 further comprising a second transistor arranged in the reception path, said second transistor having:
a control terminal coupled to the cathode terminal of the diode;
a first signal terminal coupled to the signal input of the control unit; and
a second signal terminal coupled to the second ground terminal;
wherein an anode terminal of the diode is coupled to a second signal terminal of the first transistor; and
wherein the second signal terminal of the first transistor is coupled to the control terminal of the second transistor via the diode.

19. The control device according to claim 14, wherein the number of transistors comprises a second transistor arranged in the reception path, said second transistor having:

a control terminal coupled to the cathode terminal of the diode;

a first signal terminal coupled to the signal input of the control unit;

a second signal terminal coupled to the second ground terminal.

20. The control device according to claim 19, wherein the control terminal of the second transistor is coupled to the second ground terminal via a further ohmic resistor.

21. The control device according to claim 14, wherein the signal input of the control unit is coupled to the second voltage supply source via yet another ohmic resistor.

* * * * *